United States Patent
Rozenblit

(10) Patent No.: US 8,648,657 B1
(45) Date of Patent: Feb. 11, 2014

(54) MOBILE DEVICE INCLUDING A POWER AMPLIFIER WITH SELECTABLE VOLTAGE SUPPLY

(75) Inventor: Dmitriy Rozenblit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/584,104

(22) Filed: Aug. 13, 2012

(51) Int. Cl.
*H03G 9/00* (2006.01)

(52) U.S. Cl.
USPC ............................. 330/133; 220/297; 220/127

(58) Field of Classification Search
USPC .......................................... 330/133, 297, 127
See application file for complete search history.

(56) References Cited

U.S. PATENT DOCUMENTS

| | | | |
|---|---|---|---|
| 5,559,471 A * | 9/1996 | Black | 330/277 |
| 6,781,452 B2 * | 8/2004 | Cioffi et al. | 330/10 |
| 7,042,282 B2 * | 5/2006 | Schell et al. | 330/10 |
| 7,315,152 B1 * | 1/2008 | Epperson et al. | 323/271 |
| 7,634,022 B2 * | 12/2009 | Morimoto et al. | 375/296 |
| 8,032,097 B2 * | 10/2011 | Drogi et al. | 455/127.5 |
| 8,373,400 B2 * | 2/2013 | Qiu et al. | 323/282 |
| 2013/0234793 A1 * | 9/2013 | Khlat et al. | 330/127 |

* cited by examiner

*Primary Examiner* — Patricia Nguyen
(74) *Attorney, Agent, or Firm* — Farjami & Farjami LLP

(57) ABSTRACT

The present application discloses various implementations of a mobile device including a power amplifier (PA) having a driving stage coupled to an output stage. The driving stage is configured to be selectably powered by one of a first voltage supply and a second voltage supply. The output stage is configured to be powered by the second voltage supply. The mobile device further includes a voltage supply selection switch configured to selectably power the driving stage by the second voltage supply when an output power of the PA is less than or equal to a threshold power.

20 Claims, 4 Drawing Sheets

MOBILE DEVICE INCLUDING A POWER AMPLIFIER WITH SELECTABLE VOLTAGE SUPPLY

BACKGROUND

Mobile communication devices, or "mobile devices", are widely used and increasingly relied upon for business and personal communications. As mobile devices have become ever more powerful, energy efficiency has become an increasingly important design objective. For example, the trend toward higher data rates in the uplink path for mobile communications can result in higher power consumption by a mobile device during transmission.

Because transmission during mobile communications is becoming an increasing contributor to overall power consumption, improving transmit efficiency by the mobile device power amplifier (PA) is desirable. However, the high linearity requirements of existing and developing wireless communications standards impose significant operating constraints on the mobile device PA. Consequently, there remain significant challenges to providing a mobile device capable of achieving improved transmit efficiency without significantly compromising performance.

SUMMARY

The present disclosure is directed to a mobile device including a power amplifier (PA) with selectable voltage supply, as shown in and/or described in connection with at least one of the figures, and as set forth more completely in the claims.

DETAILED DESCRIPTION

Figure 1:
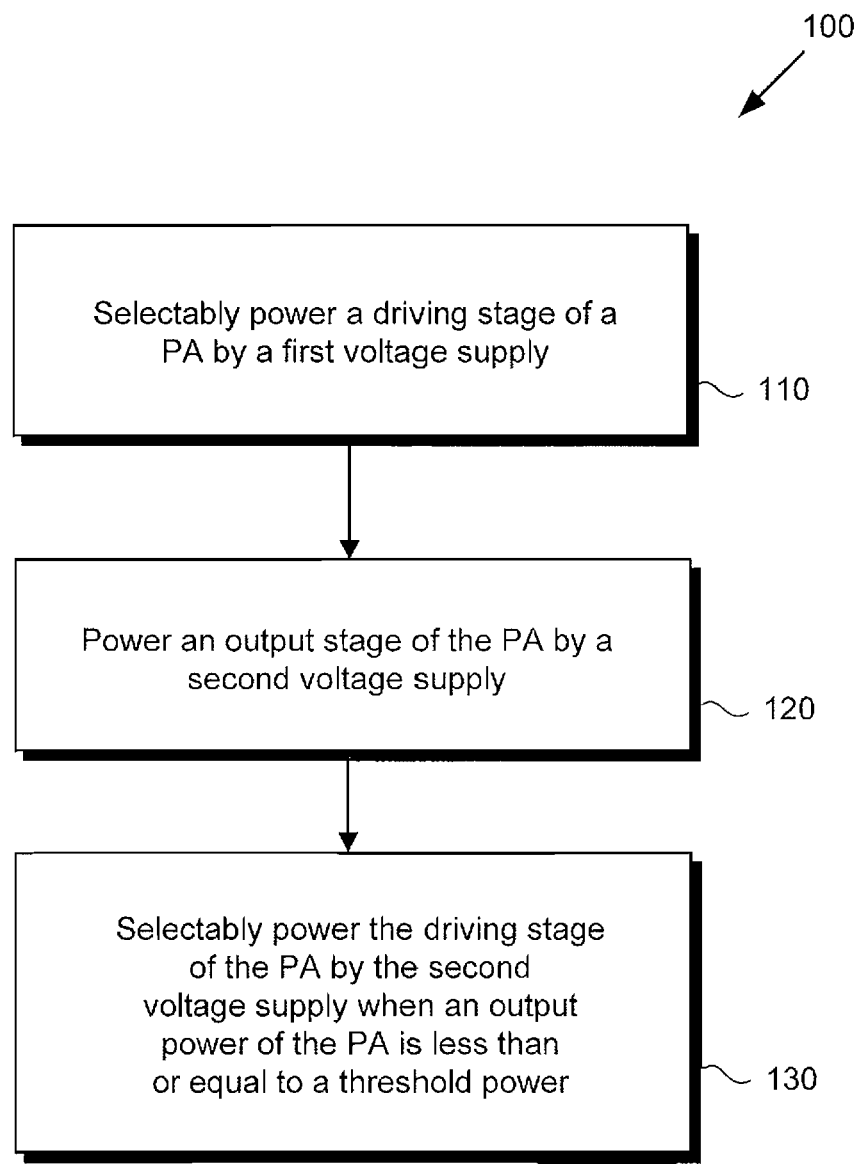
FIG. 1 shows a flowchart of an exemplary method for selectably supplying power to a mobile device power amplifier (PA), according to one implementation.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
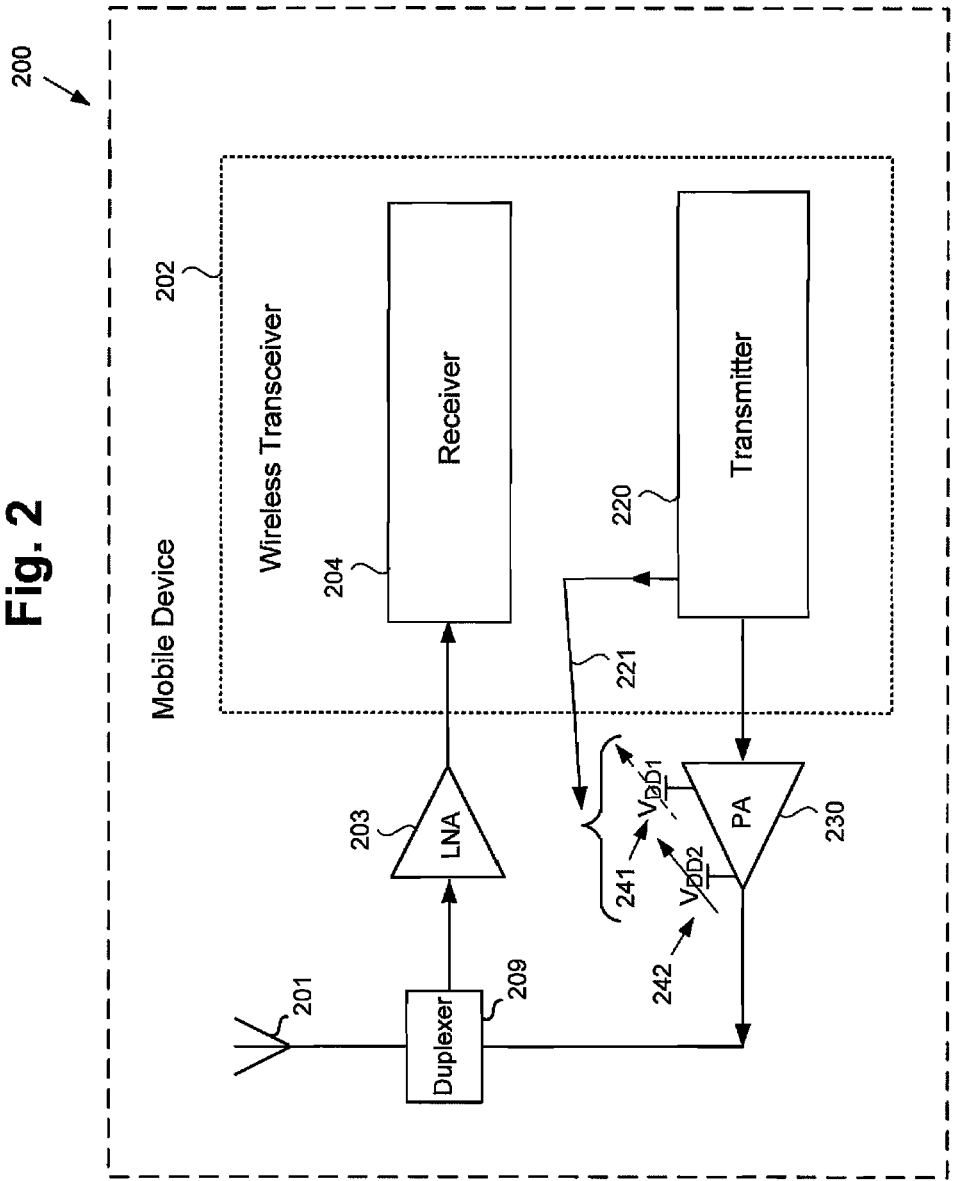
FIG. 2 shows a block diagram of an exemplary mobile device including a selectably powered PA, according to one implementation.

FIG. 1 shows a flowchart of an exemplary method for selectably supplying power to a mobile device power amplifier (PA), according to one implementation. With respect to the method outlined in FIG. 1, it is noted that certain details and features have been left out of flowchart 100 in order not to obscure the discussion of the inventive features in the present application. The exemplary method of FIG. 1 will be described by reference to the exemplary mobile device implementations shown by FIGS. 2, 3, and 4, which will be now described in some detail before continuing with the discussion of flowchart 100. FIG. 2 shows a block diagram of an exemplary mobile device including a selectably powered PA, while FIGS. 3 and 4 show respective exemplary implementations of a PA powered using a voltage supply selection switch.

Referring first to FIG. 2, mobile device 200 includes wireless transceiver 202 having receiver 204 and transmitter 220. Mobile device 200 also includes antenna 201, low-noise amplifier (LNA) 203 coupling antenna 201 to receiver 204, and PA 230 coupling transmitter 220 to antenna 201. As shown in FIG. 2, according to the present implementation, PA 230 is supplied by first voltage supply 241 and second voltage supply 242. Second voltage supply 242 is implemented as a variable or adaptive voltage supply, as indicated by the solid arrow through $V_{DD2}$. First voltage supply 241 may be implemented as either a fixed voltage supply or an adaptive voltage supply, as shown by the dashed arrow through $V_{DD1}$. Also shown in FIG. 2 are feed-forward branch 221 for providing a feed-forward signal to first voltage supply 241 and/or second voltage supply 242, as well as duplexer 209 for selectively coupling receiver 204 and transmitter 220 to antenna 201.

It is noted that although not explicitly shown as such in FIG. 2, receiver 204 typically includes mixer circuitry, as well as one or more filtering stages fed by a digital signal processing (DSP) block. It is further noted that transmitter 220 will typically be coupled to a DSP block and include transmit chain processing stages configured to provide preamplification gain control for a transmit signal. Moreover, in other implementations, the mobile device 200 may utilize a transmit/receive (T/R) switch (not shown in FIG. 2) in addition to, or in place of, duplexer 209. Mobile device 200 may be implemented as a smartphone, cell phone, tablet computer, or an e-book reader. Other exemplary implementations for mobile device 200 include a digital media player, wireless gaming console, or any other kind of system utilizing a wireless transceiver in modern electronics applications.

Figure 3:
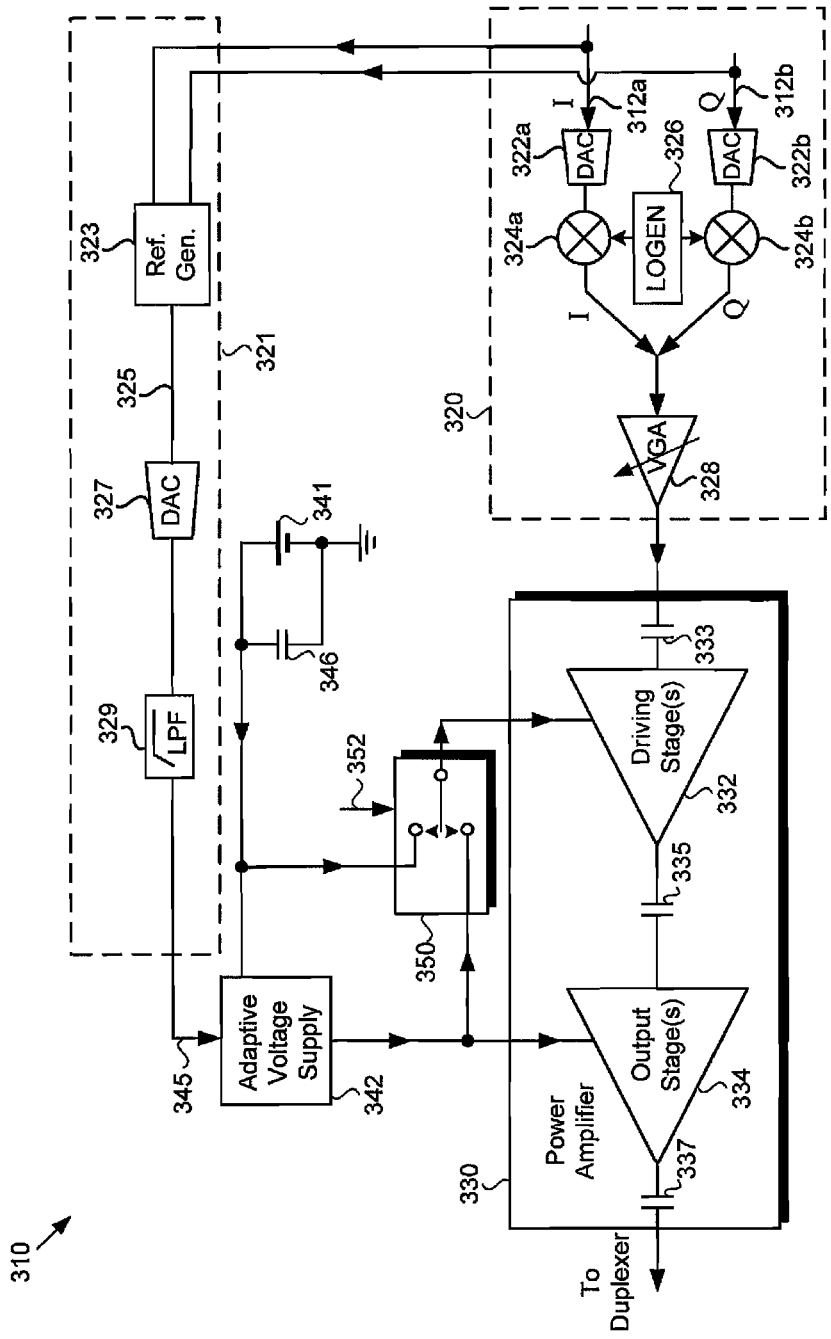
FIG. 3 shows a more detailed block diagram of a portion of the mobile device of FIG. 2 including one exemplary implementation of a PA powered using a voltage supply selection switch.
Figure 4:
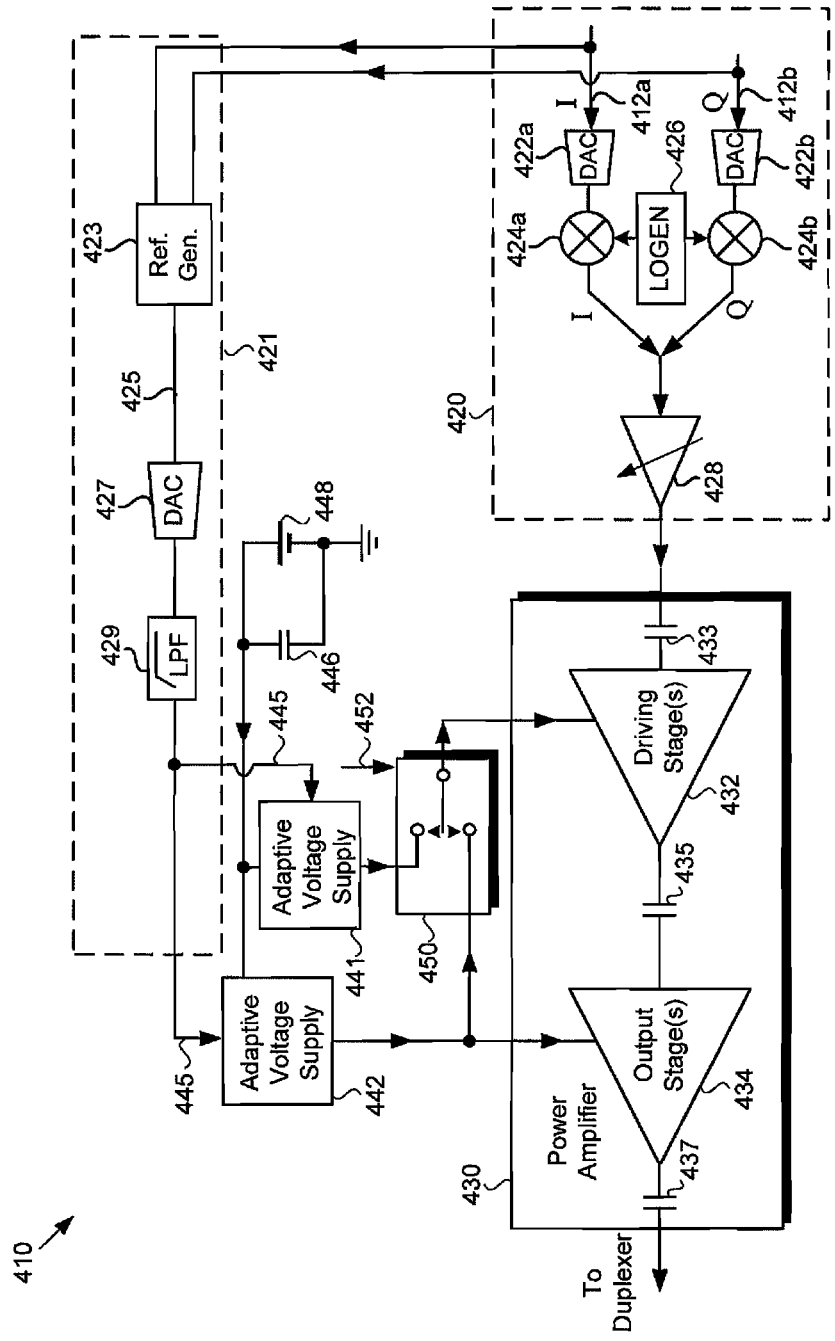
FIG. 4 shows a more detailed block diagram of a portion of the mobile device of FIG. 2 including another exemplary implementation of a PA powered using a voltage supply selection switch.

FIG. 3 shows a more detailed block diagram of a portion of the mobile device of FIG. 2 including one exemplary implementation of a PA powered using a voltage supply selection switch. Block diagram 310 shows transmitter 320, PA 330, first voltage supply 341, second voltage supply 342, voltage supply selection switch 350, and feed-forward branch 321 providing feed-forward signal 345 to second voltage supply 342. Transmitter 320, PA 330, first voltage supply 341, second voltage supply 342, and feed-forward branch 321 correspond in general to transmitter 220, PA 230, first voltage supply 241, second voltage supply 242, and feed-forward branch 221, respectively, in FIG. 2. Also shown in FIG. 3 are capacitor 346 and switch control signal 352. PA 330 includes one or more driving stage(s) 332, one or more output stage(s) 334, and isolation capacitors 333, 335, and 337. PA 330 is fed by pre-PA variable gain amplifier (VGA) 328 of transmitter 320. Transmitter 320 is shown to further include local oscillator generator (LOGEN) 326, as well as mixers 324a and 324b, and digital-to-analog converters (DACs) 322a and 322b, for processing and up-converting respective in-phase (I) and quadrature phase (Q) signals 312a and 312b.

As shown in FIG. 3, driving stage(s) 332 is coupled to output stage(s) 334 through isolation capacitor 335. As further shown in FIG. 3, driving stage(s) 332 of PA 330 is configured to be selectably powered by one of first voltage supply 341 and second voltage supply 342. Output stage(s)

334 of PA 330 is shown to be powered by second voltage supply 342. Selection of the voltage supply used to power driving stage(s) 332 is effectuated through use of voltage supply selection switch 350 in response to switch control signal 352.

According to the exemplary implementation of FIG. 3, first voltage supply 341 is a fixed voltage supply in the form of a battery. Moreover, according to the present implementation, second voltage supply 342 is shown as an adaptive voltage supply, such as an adaptive switched mode power supply (adaptive SMPS). Second voltage supply 342 may be configured to power output stage(s) 334 so as to produce the minimum required headroom for operation of output stage(s) 334, in order to substantially minimize power consumption by output stage(s) 334. Second voltage supply 342 may be configured to power output stage(s) 334 using any suitable, dynamic or quasi-dynamic adaptive voltage supply technique.

One example of a dynamically adaptive voltage supply technique is Envelope Tracking (ET), wherein the substantially instantaneous peak signal envelope power produced by PA 330 is used to determine the voltage supplied by second voltage supply 342. An example of a quasi-dynamic adaptive voltage supply technique is Average Power Tracking (APT), in which the average signal envelope power produced by PA 330 during a designated time slot or time window is used to determine the voltage supplied by second voltage supply 342.

Thus, in one implementation, second voltage supply 342 may be configured for operation in ET mode, while in another implementation, second voltage supply 342 may be configured for operation in APT mode. In yet another implementation, second voltage supply 342 may be a multi-mode adaptive voltage supply configured to be selectively operable in one of two or more modes. For example, in one such implementation, second voltage supply 342 may be an adaptive SMPS selectively operable in ET mode and APT mode.

As shown in FIG. 3, second voltage supply 342 receives feed-forward signal 345 as an input. Feed-forward signal 345 may be used by logic circuitry internal to second voltage supply 342 (logic circuitry not shown in FIG. 3) to determine a suitable supply voltage for operation of output stage(s) 334. Feed-forward signal 345 is produced by feed-forward branch 321 including reference generator 323, DAC 327, and low-pass filter (LPF) 329. Reference generator 323 is configured to receive respective I and Q signals 312a and 312b as inputs, and to generate reference signal 325 as an output. Reference signal 325 is then processed by DAC 327 and LPF 329 to provide feed-forward signal 345 to second voltage supply 342 for use in adaptively powering at least output stage(s) 334.

FIG. 4 shows a block diagram of a portion of the mobile device of FIG. 2 including another exemplary implementation of a PA powered using a voltage supply selection switch. Block diagram 410 shows transmitter 420, PA 430, first voltage supply 441, second voltage supply 442, voltage supply selection switch 450, and feed-forward branch 421 providing feed-forward signal 445 to first and second voltage supplies 441 and 442. Transmitter 420, PA 430, first voltage supply 441, second voltage supply 442, and feed-forward branch 421 correspond in general to transmitter 220, PA 230, first voltage supply 241, second voltage supply 242, and feed-forward branch 221, respectively, in FIG. 2.

In addition, transmitter 420, PA 430, second voltage supply 442, feed-forward branch 421, and voltage supply selection switch 450 correspond respectively to transmitter 320, PA 330, second voltage supply 342, feed-forward branch 321, and voltage supply selection switch 350, in FIG. 3. That is to say, transmitter 420, PA 430, second voltage supply 442, feed-forward branch 421, and voltage supply selection switch 450 may share any of the characteristics attributed to their corresponding features in FIG. 3, above. Also shown in FIG. 4 are capacitor 446 and battery 448.

As shown in FIG. 4, driving stage(s) 432 is coupled to output stage(s) 434 through isolation capacitor 435. As further shown in FIG. 4, driving stage(s) 432 of PA 430 is configured to be selectably powered by one of first voltage supply 441 and second voltage supply 442, which are both implemented as adaptive voltage supplies in FIG. 4. Output stage(s) 434 of PA 430 is shown to be powered by second voltage supply 442. Selection of the voltage supply used to power driving stage(s) 432 is effectuated through use of voltage supply selection switch 450 in response to switch control signal 452.

As noted, first and second voltage supplies 441 and 442 are shown as adaptive voltage supplies, and each may be implemented as an adaptive SMPS. First voltage supply 441 may be configured to power driving stage(s) 432 adaptively in order to reduce power consumption by driving stage(s) 432. First voltage supply 441 may be configured to power driving stage(s) 432 using any suitably stable quasi-dynamic or quasi-static adaptive voltage supply technique, such as APT mode.

Second voltage supply 442 may be configured to power output stage(s) 434 so as to produce the minimum required headroom for operation of output stage(s) 434, in order to substantially minimize power consumption by output stage(s) 434. As a result, second voltage supply 442 may be configured to power output stage(s) 434 using any suitable, dynamic or quasi-dynamic adaptive voltage supply technique, such as ET mode or APT mode. Moreover, in one implementation, second voltage supply 442 may be a multi-mode adaptive voltage supply configured to be selectively operable in one of two or more modes, such as ET mode and APT mode.

As shown in FIG. 4, first and second voltage supplies 441 and 442 receive feed-forward signal 445 as an input. Feed-forward signal 445 may be used by respective logic circuitry internal to first and second voltage supplies 441 and 442 (logic circuitry not shown in FIG. 3) to determine suitable supply voltages for operation of driving stage(s) 432 and output stage(s) 434.

Thus, in one selectably closed position of voltage supply selection switch 450, driving stage(s) 432 and output stage(s) 434 are powered by respective separate first and second adaptive voltage supplies 441 and 442. However, voltage supply selection switch may be used to power both of driving stage(s) 432 and output stage(s) 434 by second adaptive voltage supply 442 when such a power supply configuration is advantageous or desirable.

The selectable power supply solutions represented in FIGS. 3 and 4 will now referenced in combination with flowchart 100, in FIG. 1. Flowchart 100 begins with selectably powering driving stage(s) 332/432 of PA 330/430 by first voltage supply 341/441 (110) and continues with powering output stage(s) 334/434 by second voltage supply 342/442 (120).

As noted above, there is an ongoing trend toward higher data rates in the uplink path for mobile communications, resulting in higher power consumption by a mobile device, such as mobile device 100, in FIG. 1, during transmission. Because transmission during mobile communications is becoming an increasing contributor to overall power consumption, improving transmit efficiency by PA 330/430 is desirable.

One possible solution for improving transmit efficiency is to utilize a dynamically adaptive voltage supply technique, such as ET mode, to power PA 330/430. ET mode allows dynamic control of the supply voltage of PA 330/430 as a function of the signal envelope to increase overall transmit energy efficiency. Unfortunately, however, use of ET mode to produce a modulation of the supply voltage for PA 330/430 can produce substantially undesirable affects when the same voltage supply is used to power driving stage(s) 332/432 and output stage(s) 334/434 during high power operation by PA 330/430. For example, modulation of a shared supply voltage at high power may result in amplitude and/or phase distortions in early stages of driving stage(s) 332/432. Those distortions can be further amplified by subsequent stages, including output stage(s) 334/434, and thereby compromise linearity.

Other approaches to powering all stages of PA 330/430 concurrently, such as use of a fixed voltage supply, or use of a quasi-dynamic adaptive voltage technique like APT mode, fail to achieve desirable levels of power efficiency. For example, although APT mode is more efficient than use of a fixed voltage supply, it is much less efficient than ET mode at higher power levels. As shown by FIGS. 2 and 3, implementations of the present inventive concepts enable decoupling of the voltage supplies for driving stage(s) 332/432 and output stage(s) 334/434 during high power operation of PA 330/430. That result may be achieved, for example, using voltage supply selection switch 350/450 to selectably power driving stage(s) 332/432 by first voltage supply 341/441, while output stage(s) 334/434 is powered by second voltage supply 342/442.

As shown in FIG. 3, in one implementation, first voltage supply 341 may be a fixed voltage supply, such as a battery. In another implementation, as shown in FIG. 4, first voltage supply 441 may be a quasi-dynamic or quasi-static voltage supply, such as an adaptive SMPS configured to operate in APT mode. Voltage supply selection switch 350/450 may be selectably switched using switch control signal 352/452 produced by circuitry within wireless transceiver 202, in FIG. 2, (internal transceiver circuitry for producing switch control signal 352/452 not represented in FIG. 2).

Flowchart 100 continues with selectably powering driving stage(s) 332/432 by second voltage supply 342/442 when the output power of PA 330/430 is less than or equal to a threshold power (130). Selectable powering of driving stage(s) 332/432 by second voltage supply 342/442 can be performed using voltage supply selection switch 350/450. Voltage supply selection switch 350/450 can be switched using switch control signal 352/452 so as to decouple driving stage(s) 332/432 from first voltage supply 341/441 and to couple driving stage(s) 332/432 to second voltage supply 342/442. Examples of a threshold power at which driving stage(s) 332/432 may be selectably powered by second voltage supply 342/442 are approximately 8 dB or 10 dB below a maximum output power of PA 330/430.

As described above, in one implementation, second voltage supply 342/442 may be a multi-mode power supply selectably operable in one of ET mode and APT mode. In such an implementation, second voltage supply 342/442 may be configured to operate in ET mode when the output power of PA 330/430 is above the threshold power, e.g., 8-10 dB below maximum output power. Moreover, in such an implementation, second voltage supply 342/442 may be configured to transition to APT mode operation when the output power of PA 330/430 reduces to the threshold power. In that implementation, driving stage(s) 332/432 and output stage(s) 334/434 are powered by second voltage supply 341/441 using APT mode when the output power of PA 330/430 is less than or equal to the threshold power. It is noted that, unlike the case for high power operation of PA 330/430, during low power operation by PA 330/430 the efficiency achievable using APT mode may be comparable to the efficiency produced using ET mode.

Thus, the present application discloses a mobile device solution providing improved transmit power efficiency without sacrificing performance. By selectably powering the driving and output stages of a transmitter PA using separate voltage supplies, implementations of the present inventive concepts enable modulation of the output stage supply voltage while avoiding production of distortion in the driving stage. As a result, a dynamically adaptive voltage supply technique, such as ET mode, can be used to significantly improve PA efficiency at high power. In addition, by selectably powering the driving and output stages using the same adaptive voltage supply when the PA output power falls to or below a threshold power, the present concepts enable improved transmit efficiency at substantially all output levels.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A mobile device comprising:
a power amplifier (PA) having a driving stage coupled to an output stage;
said driving stage configured to be selectably powered by one of a first voltage supply and a second voltage supply;
said output stage configured to be powered by said second voltage supply;
a voltage supply selection switch configured to selectably power said driving stage by said second voltage supply when an output power of said PA is less than or equal to a threshold power.

2. The mobile device of claim 1, wherein said first voltage supply is a fixed voltage supply.

3. The mobile device of claim 1, wherein said first voltage supply is an adaptive voltage supply.

4. The mobile device of claim 1, wherein said second voltage supply is an adaptive voltage supply configured for operation in one of at least a first mode and a second mode.

5. The mobile device of claim 1, wherein said second voltage supply is an adaptive voltage supply configured for operation in an Envelope Tracking (ET) mode.

6. The mobile device of claim 1, wherein said second voltage supply is an adaptive voltage supply configured for operation in an Average Power Tracking (APT) mode.

7. The mobile device of claim 1, wherein said driving stage and said output stage are powered by said second voltage supply using an APT mode when said output power of said PA is less than or equal to said threshold power.

8. The mobile device of claim 1, wherein said threshold power is at least 8 dB below a maximum output power of said PA.

9. A mobile device comprising:
a power amplifier (PA) having a driving stage coupled to an output stage;
said driving stage configured to be selectably powered by one of a first adaptive voltage supply and a second adaptive voltage supply;
said output stage configured to be powered by said second adaptive voltage supply in one of a first mode and a second mode;
a voltage supply selection switch configured to selectably power said driving stage by said second adaptive voltage supply in said second mode when an output power of said PA is less than or equal to a threshold power.

10. The mobile device of claim 9, wherein said second adaptive voltage supply is configured for operation in an Envelope Tracking (ET) mode.

11. The mobile device of claim 9, wherein said second adaptive voltage supply is configured for operation in an Average Power Tracking (APT) mode.

12. The mobile device of claim 9, wherein said driving stage and said output stage are powered by said second adaptive voltage supply using an APT mode when said output power of said PA is less than or equal to said threshold power.

13. The mobile device of claim 9, wherein said threshold power is at least 8 dB below a maximum output power of said PA.

14. A method comprising:
selectably powering a driving stage of a power amplifier (PA) by a first voltage supply;
powering an output stage of said PA by a second voltage supply;
selectably powering said driving stage of said PA by said second voltage supply when an output power of said PA is less than or equal to a threshold power.

15. The method of claim 14, wherein said first voltage supply is a fixed voltage supply.

16. The method of claim 14, wherein said first voltage supply is an adaptive voltage supply.

17. The method of claim 14, wherein said second voltage supply is an adaptive voltage supply configured for operation in one of at least a first mode and a second mode.

18. The method of claim 14, wherein said second voltage supply is an adaptive voltage supply configured for operation in at least one of an Envelope Tracking (ET) mode and an Average Power Tracking (APT) mode.

19. The method of claim 14, wherein said driving stage and said output stage are powered by said second voltage supply using an APT mode when said output power of said PA is less than or equal to said threshold power.

20. The method of claim 14, wherein said threshold power is at least 8 dB below a maximum output power of said PA.

* * * * *